United States Patent

Mao et al.

[11] Patent Number: 6,134,090
[45] Date of Patent: Oct. 17, 2000

[54] ENHANCED SPIN-VALVE/GMR MAGNETIC SENSOR WITH AN INSULATING BOUNDARY LAYER

[75] Inventors: Sining Mao, Savage; Edward S. Murdock, Edina, both of Minn.

[73] Assignee: Seagate Technology LLC, Scotts Valley, Calif.

[21] Appl. No.: 09/153,581

[22] Filed: Sep. 15, 1998

Related U.S. Application Data

[60] Provisional application No. 60/078,875, Mar. 20, 1998.

[51] Int. Cl.[7] .................................................. G11B 5/39
[52] U.S. Cl. ................................. 360/324.1; 360/324.11
[58] Field of Search ............................... 360/113, 324.1, 360/324.11; 338/32 R; 324/252

[56] References Cited

U.S. PATENT DOCUMENTS

| | | | |
|---|---|---|---|
| 4,949,039 | 8/1990 | Grunberg | 324/252 |
| 5,206,590 | 4/1993 | Dieny et al. | 324/252 |
| 5,315,468 | 5/1994 | Lin et al. | 360/113 |
| 5,422,571 | 6/1995 | Gurney et al. | 324/252 |
| 5,475,304 | 12/1995 | Prinz | 324/207.21 |
| 5,534,355 | 7/1996 | Okuno et al. | 428/611 |
| 5,549,977 | 8/1996 | Jin et al. | 428/692 |
| 5,583,725 | 12/1996 | Coffey et al. | 360/113 |
| 5,608,593 | 3/1997 | Kim et al. | 360/113 |
| 5,616,370 | 4/1997 | Okuno et al. | 427/547 |
| 5,633,770 | 5/1997 | Che | 360/113 |
| 5,648,885 | 7/1997 | Nishioka et al. | 360/113 |
| 5,650,887 | 7/1997 | Dovek et al. | 360/75 |
| 5,686,838 | 11/1997 | Van den Berg | 324/252 |
| 5,688,605 | 11/1997 | Iwasaki et al. | 428/611 |
| 5,696,655 | 12/1997 | Kawano et al. | 360/113 |
| 5,696,656 | 12/1997 | Gill et al. | 360/113 |
| 5,701,222 | 12/1997 | Gill et al. | 360/113 |
| 5,702,832 | 12/1997 | Iwasaki et al. | 428/611 |
| 5,705,973 | 1/1998 | Yuan et al. | 338/32 R |
| 5,717,550 | 2/1998 | Nepela et al. | 360/113 |
| 5,725,963 | 3/1998 | Iwasaki et al. | 428/611 |
| 5,738,946 | 4/1998 | Iwasaki et al. | 428/611 |
| 5,739,988 | 4/1998 | Gill | 360/113 |
| 5,739,990 | 4/1998 | Ravipati et al. | 360/113 |
| 5,742,162 | 4/1998 | Nepela et al. | 324/252 |
| 5,742,458 | 4/1998 | Koike et al. | 360/113 |
| 5,751,521 | 5/1998 | Gill | 360/113 |
| 5,756,191 | 5/1998 | Hashimoto et al. | 428/209 |
| 5,764,056 | 6/1998 | Mao et al. | 324/252 |
| 5,768,069 | 6/1998 | Mauri | 360/113 |
| 5,862,021 | 1/1999 | Deguchi et al. | 360/113 |
| 5,958,611 | 9/1999 | Ohta et al. | 428/692 |
| 5,989,690 | 11/1999 | Fujikata et al. | 428/212 |
| 5,998,016 | 12/1999 | Sasaki et al. | 428/336 |

FOREIGN PATENT DOCUMENTS 10-3620  1/1998  Japan.

OTHER PUBLICATIONS

"AMR Effect in Spin–Valve Structure," by Y. Uchara et al., IEEE Transactions on Magnetics. vol 32. No. 5. Sep. 1996, pp. 3432–3433.

"Domain Stabilization With MR Heads," by Devasahayam et al., NSIC Heads Program Monthly Report, Feb. 14, 1996.

"Exchange Biasing with NiMn," by Devasahayam et al., NSIC Meeting, Dec. 12, 1995.

(List continued on next page.)

*Primary Examiner*—Jefferson Evans
*Attorney, Agent, or Firm*—Westman, Champlin & Kelly, P.A.

[57] ABSTRACT

A spin valve sensor is constructed with an electrically conductive antiferromagnetic pinning layer. A first ferromagnetic layer is placed proximate the pinning layer. A second ferromagnetic layer is included with a non-ferromagnetic electrically conductive layer placed between the first and second ferromagnetic layers. A boundary layer of electrically insulating material is placed proximate to the second layer of ferromagnetic material opposite the non-ferromagnetic electrically conductive layer. Preferred embodiments exhibit an enhanced giant magnetoresistive (GMR) effect presumably due to scattering that is more specular at the interface with the electrically insulating material.

25 Claims, 3 Drawing Sheets

OTHER PUBLICATIONS

"Exchange Biasing with NiMn," by Devasahayam et al., DSSC Spring '96 Review, Carnegie Mellon University.

Improved Exchange Coupling Between Ferromagnetic Ni–Fe and Antiferromagnetic Ni–Mn–based Films, by Lin et al., *Appl. Phys. Lett.*, vol. 65, No. 9, pp. 1183–1185, Aug. 29, 1994.

"Linearity of Unshielded Spin–Valve Sensors," by Sugawara et al., Appl. Phys. Lett. 60 (4), Jan. 27, 1997 pp. 523–525.

"NiMn–Pinned Spin Valves With High Pinning Field Made by Ion Beam Sputtering," by Mao et al., Appl. Phys. Lett. 69 (23). Dec. 2, 1996 pp. 3593–3595.

"Spin Valve Heads at Seagate Technology," by Murdock, Discon Conference, Sep. 1996.

ENHANCED SPIN-VALVE/GMR MAGNETIC SENSOR WITH AN INSULATING BOUNDARY LAYER

CROSS REFERENCE TO RELATED APPLICATIONS

This application claims priority to Provisional patent application Ser. No. 60/078875, entitled "A Structure to Enhance Mn-Based Alloy Spin Valve/GMR Head Output Amplitude Utilizing Electron Specular Effect," filed on Mar. 20, 1998.

BACKGROUND OF THE INVENTION

The invention relates to spin valve sensors for use in magnetic disc read/write heads.

Magnetic sensors utilizing giant magnetoresistance (GMR) effects have utility as magnetic sensors, especially in magnetoresistive read heads used in magnetic disc storage systems. The GMR effect is observed in ultrathin, electrically conductive multilayer systems having magnetic layers. Magnetic sensors utilizing the GMR effect are frequently referred to as "spin valve" sensors.

A spin valve sensor is typically a sandwiched structure including two ferromagnetic layers separated by a thin non-ferromagnetic layer. One of the ferromagnetic layers is called the "pinned layer" because it is magnetically pinned or oriented in a fixed and unchanging direction. One common method of maintaining the magnetic orientation of the pinning layer is through anti-ferromagnetic exchange coupling utilizing a proximate, i.e. adjacent or nearby, anti-ferromagnetic layer, commonly referred to as the "pinning layer." The other ferromagnetic layer is called the "free" or "unpinned" layer because its magnetization can rotate in response to the presence of external magnetic fields.

The benefits of spin valve sensors result from a large difference in electrical conductivity exhibited by the devices depending on the relative alignment between the magnetizations of the two ferromagnetic layers. In order for anti-ferromagnetially pinned spin valve sensors to function effectively, a sufficient pinning field from the pinning layer is required to keep the pinned ferromagnetic layer's magnetization unchanged during operation. Various anti-ferromagnetic materials, such as NiMn, FeMn, NiO, IrMn, PtPdMn, CrMnPt, RuRhMn, and TbCo, have been used or proposed as antiferromagnetic pinning layers for spin valve sensors

SUMMARY OF THE INVENTION

In one aspect, the invention features a spin valve sensor comprising:
an antiferromagnetic, electrically conductive pinning layer;
a first layer of ferromagnetic material proximate the pinning layer;
a second layer of ferromagnetic material;
a layer of non-ferromagnetic electrically conductive material positioned between the first and second layers of ferromagnetic material; and
a boundary layer of electrically insulating material adjacent the second layer of ferromagnetic material opposite the layer of non-ferromagnetic, electrically conductive material.

In another aspect, the invention features a method of producing a spin valve sensor, the method comprising:

assembling a multilayer structure on an electrically insulating substrate, the multilayer structure comprising:
a first layer of ferromagnetic material;
a second layer of ferromagnetic material;
a spacer layer of electrically conducting, non-ferromagnetic material positioned between the first and second layers of ferromagnetic material;
a pinning layer comprising manganese, proximate the first ferromagnetic layer and opposite the spacer layer; and
an electrically insulating layer proximate the second layer of ferromagnetic material and opposite the layer of electrically conducting non-ferromagnetic material.

DESCRIPTION OF THE PREFERRED EMBODIMENTS

It has been discovered that placement of an electrically insulating layer adjacent to a free or unpinned ferromagnetic layer within a Giant Magneto-Resistive (GMR) spin valve with an electrically-conductive antiferromagnetic pinning layer can result in an enhanced GMR effect. Preferred pinning layers contain manganese. A relevant spin valve GMR generally includes an antiferromagnetic pinning layer, a first or pinned ferromagnetic layer proximate the pinning layer, a second or free ferromagnetic layer and a non-ferromagnetic layer between the first and second ferromagnetic layers.

If the pinning layer is proximate a substrate, the spin valve is referred to as a bottom spin valve. In bottom spin valve embodiments, the free ferromagnetic layer is at the top of the spin valve structure so that thin electrically insulating layers can be generated at its surface without affecting the stacks below. In top spin valve embodiments, the free ferromagnetic layer is at the bottom of the spin valve structure proximate to a substrate. In the preferred layer arrangement, the pinning layer is placed proximate to a substrate such that the deposition of a thin insulating layer adjacent to the free ferromagnetic layer does not disrupt the crystal lattice of the other layers of the spin valve. Other embodiments include symmetric spin valves having two pinning layers with one on either side of the spin valve and duplicate pinned ferromagnetic layers and duplicate spacer layers in a symmetric arrangement.

The presence of the electrically insulating layer adjacent to the free ferromagnetic layer evidently generates flatter electronic surfaces, which promote the specular scattering of electrons. The GMR effect results from reduced scattering of conduction electrons when the magnetic fields of the two ferromagnetic layers are aligned. At the edge of the ferromagnetic layer, diffusive or specular scattering can occur. Diffusive scattering results in the loss of momentum and spin coherence. In contrast, specular scattering preserve momentum and spin coherence. Thus, increased specular scattering of electrons at the edge of the free ferromagnetic material results in the enhanced GMR effect.

Figure 1:
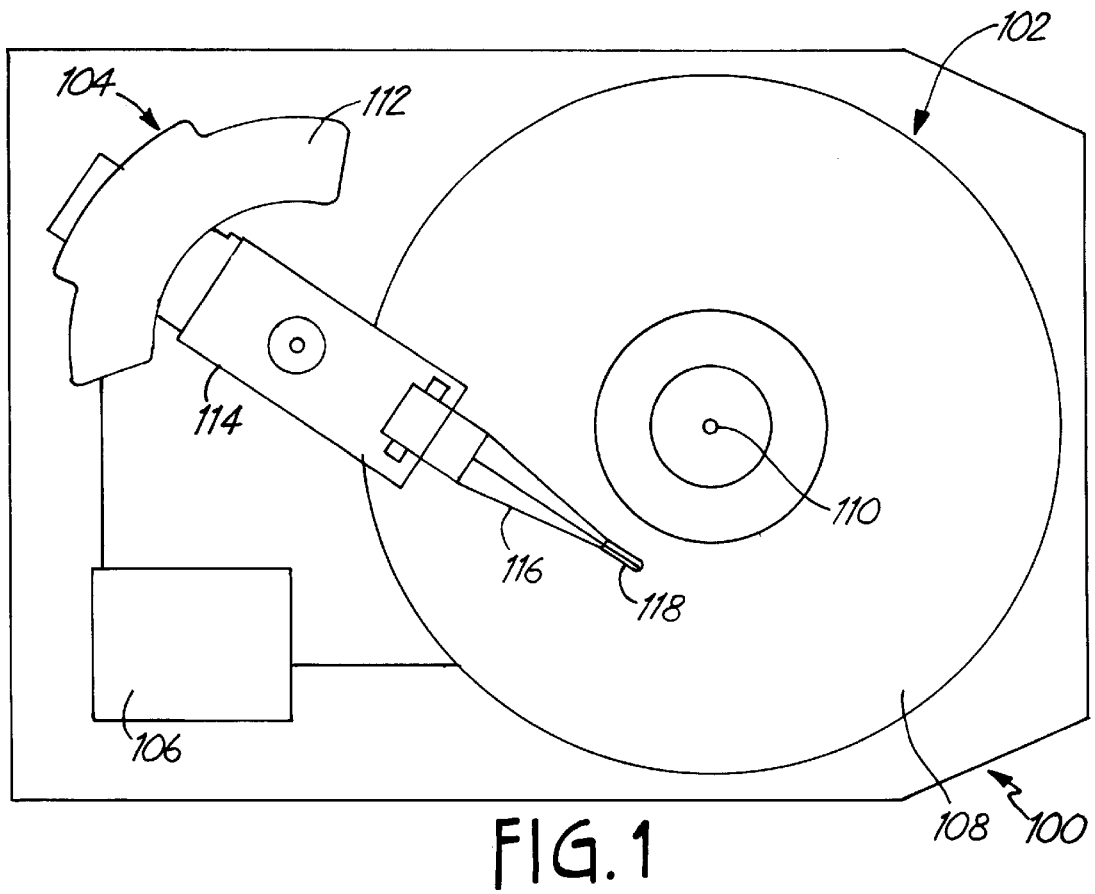
FIG. 1 is a schematic, top view of a disc drive system.

FIG. 1 depicts an embodiment of a disc drive system 100 including drive unit 102, actuator assembly 104 and controller 106. Drive unit 102 includes disc 108 and spindle 110 connected to a spindle motor. In the embodiment shown, actuator assembly 104 includes actuator 112, support arm 114, load beam 116 and gimble/head assembly 118. Actuator 112 controls the position of gimble/head assembly 118 over disc 108 by rotating or laterally moving support arm 114. Load beam 116 is located at the end of support arm 114 and gimble/head assembly 118 is located at the end of load beam 116. Controller 106 instructs actuator 112 regarding the position of support arm 114 over disc 108 and drive unit 102 regarding the control of the spindle motor.

Figure 2:
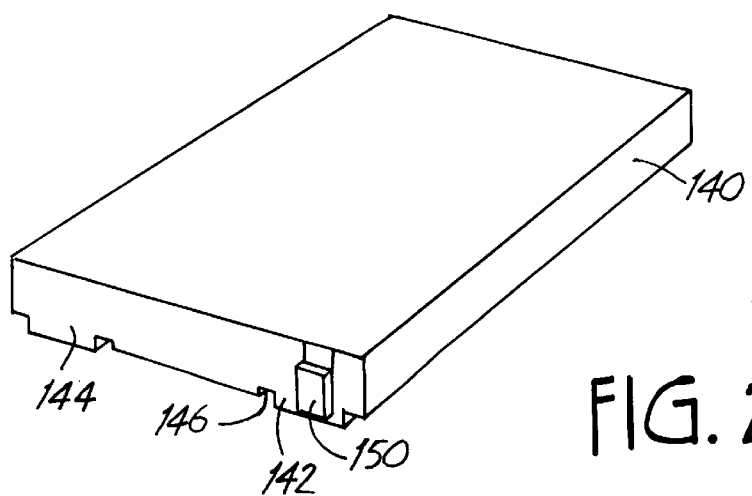
FIG. 2 is a schematic, perspective view of a slider with a spin valve/GMR sensor.

Gimble/head assembly 118 includes a slider which, in operation, flies just above the disc surface. FIG. 2 depicts an embodiment of a slider 140. In the embodiment shown, glider 140 includes two rails 142, 144 oriented along the length of air bearing surface 146. Other structure in addition or alternative to rails 142, 144 can be contoured into the air bearing surface to alter the aerodynamic performance of slider 140. GMR spin valve 150 is located at or near the rear edge of slider 140.

The spin valve is deposited in layer onto the slider body. The substrate, on which the spin valve is deposited, is an electrically insulating layer that forms a boundary of the spin valve referred to as a 1st half gap. Additional layers such as an $Al_2O_3$ base coat and a bottom shield can be placed between the 1st half gap and the slider body. An electrically insulating layer referred to as a second half gap is placed over the spin valve. The entire structure is covered at its top surface with a top shield or shared pole.

Figure 3:
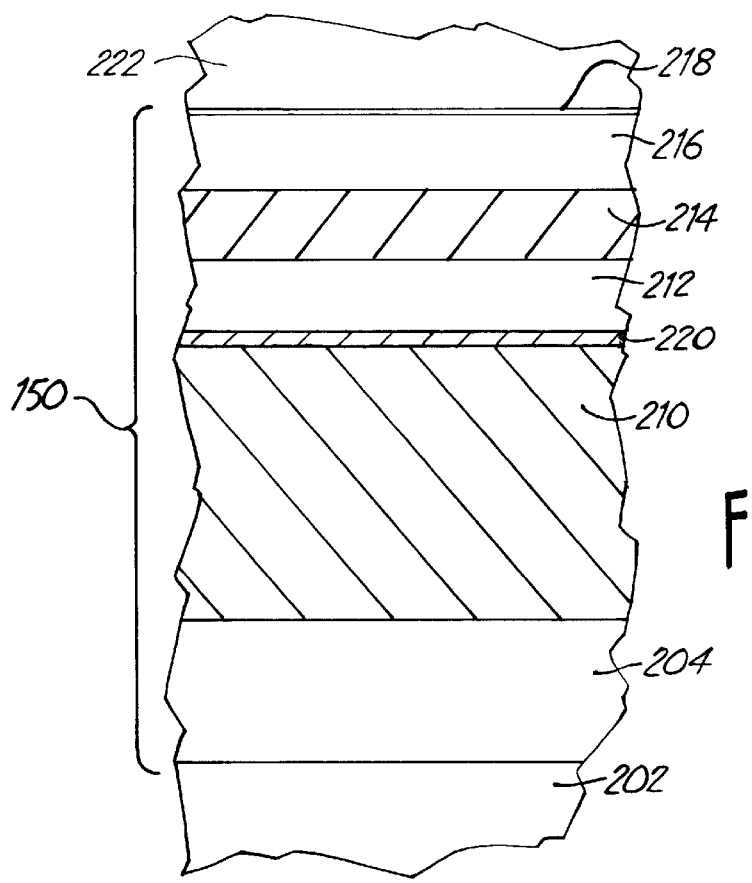
FIG. 3 is a schematic, fragmentary, side view of a spin valve/GMR sensor on a substrate.

Referring to FIG. 3, a preferred embodiment of spin valve 150 is located on a substrate 202. Substrate 202 preferably is a layer of $Al_2O_3$, aluminum nitride, diamond-like carbon or other electrically insulating material. Substrate 202 is referred to as a first half gap and is oriented toward the slider body.

Spin valve 150 includes an optional seed layer 204, pinning layer 210, pinned ferromagnetic layer 212, spacer layer 214, free ferromagnetic layer 216, electrically insulating layer 218 and electrically insulating layer 220. A second half gap 222 is located over the spin valve. Seed layer 204 provides a transition between the crystal lattice of the adjacent spin valve layers and the lattice of the substrate such that the crystal lattice of the spin valve layers is not significantly disrupted at the interface. Suitable materials for the seed layer include, for example, tantalum (Ta) and bilayers of Ta and NiFe. Ta seed layers generally have a thickness on the order of about 35 Å. Other materials and thicknesses can be used as appropriate.

Pinning layer 210 is an antiferromagnetic layer. Suitable antiferromagnetic materials for the pinning layer include, for example, the following manganese alloys: NiMn, FeMn, IrMn, PtPdMn, RuMn, RhMn and CrMnPt. The use of NiMn pinning layers is described in U.S. Pat. No. 5,764,056, entitled "Nickel-Manganese Pinned Spin Valve/GMR Magnetic Sensors," incorporated herein by reference. Pinning layer 210 preferably has a thickness from about 80 Å to about 500 Å, and more preferably from about 100 Å to about 300 Å.

Spacer layer 214 is made from non-ferromagnetic, electrically conducting material. Spacer layer magnetically uncouples pinned ferromagnetic layer 212 from free ferromagnetic layer 216. A variety of non-ferromagnetic, electrically conducting materials can be used for spacer layer 214. Preferred materials for spacer layer 214 include, for example, copper, CuAu and CuAg. Spacer layer 214 generally has a thickness from about 25 Å to about 50 Å. In preferred embodiments, spacer layer 214 is a layer of copper with a thickness from about 25 Å to about 35 Å.

Ferromagnetic layers 212, 216 can be single layer or, preferably, multilayered structures. Suitable ferromagnetic, electrically conducting materials for the formation of ferromagnetic layers 212, 216 include, for example, Co, NiFe, CoFe, CoZrNb, NiFeCr, AlSiFe and NiFeRe. The arrangement of component layers, number of component layers and thickness of component layers within ferromagnetic layers 212, 216 can be adjusted to achieve desired characteristics.

Figure 4:
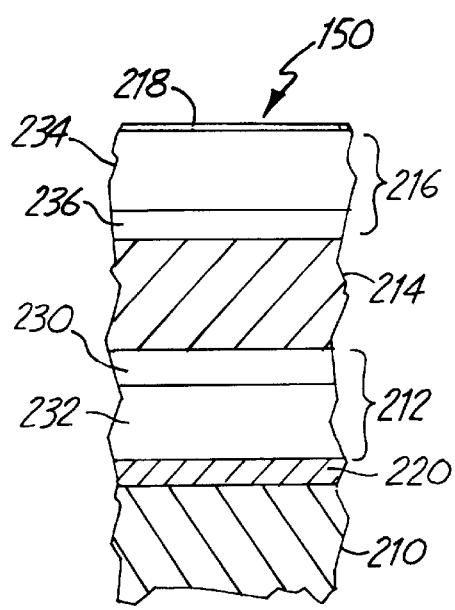
FIG. 4 is a schematic, fragmentary, side view of an embodiment of the spin valve/GMR sensor of FIG. 3 with ferromagnetic layers having two component layers each.

The simplest structure for ferromagnetic layers 212, 216 is a single layer of ferromagnetic material, as shown in FIG. 3. Alternatively, ferromagnetic layers 212, 216 each can have two component layers of ferromagnetic material 230, 232 and 234, 236, as shown in FIG. 4. In a preferred two component layer embodiment, layers 230 and 236 are cobalt with a thickness of about 15 Å, and layers 232 and 234 are NiFe with a thickness of about 50 Å.

Figure 5:
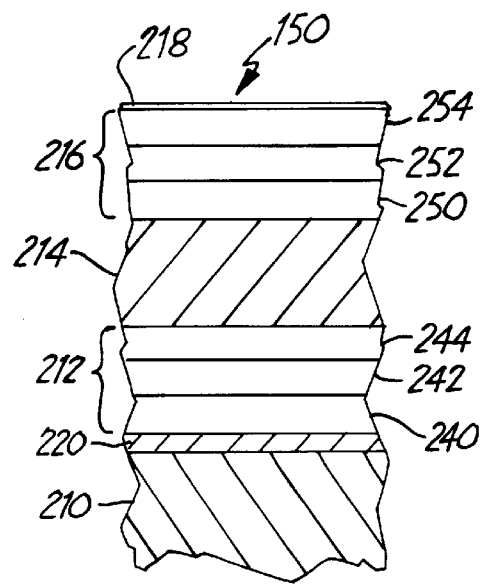
FIG. 5 is a schematic, fragmentary, side view of an embodiment of the spin valve/GMR sensor of FIG. 3 with ferromagnetic layers having three component layers each.

In another preferred embodiment, ferromagnetic layer 212 has three component layers 240, 242, 244, and ferromagnetic layer 216 has three component layers 250, 252, 254, see FIG. 5. In a preferred three component layer embodiment, component layers 240 and 254 are CoFe alloy with a thickness of about 30 Å. Component layers 242, 252 are NiFe with a thickness of about 30 Å. Component layers 244 and 250 are cobalt with a thickness of about 20 Å. If desired, other combinations of materials and/or different numbers of component layers can be used to form either or both of ferromagnetic layers 212, 216. Ferromagnetic layers 212, 216 do not have necessarily the same number, composition and/or thickness of the component layers as each other.

The orientation of the magnetic moment of pinned ferromagnetic layer 212 is fixed by its proximity to pinning layer 210. In contrast, the orientation of free ferromagnetic layer 216 is oriented by the magnetic moment of the disc surface as the slider flies over the magnetic disc. The relative orientation of the magnetic moment in the pinned ferromagnetic layer and in the free ferromagnetic layer results in the Giant Magneto-Resistive (GMR) effect when the layers have sufficient thinness and the materials are properly selected.

Electrically insulating layer 218 preferably is an oxide layer formed by oxidizing the top portion of ferromagnetic layer 216. The electrically insulating nature of layer 218 generates flatter electronic surfaces that promote specular scattering of conduction electrons. This specular scattering leads to an observed enhanced GMR effect.

The oxide layer can be formed using an oxygen plasma formed by application of a voltage to ferromagnetic layer 216 in an oxygen atmosphere. Alternatively, an oxide layer can be formed by thermal oxidation obtained by heating ferromagnetic layer 216 under an oxygen atmosphere. In addition, the oxide layer can be formed by sputtering a portion of ferromagnetic layer 216 in the presence of an oxygen atmosphere (reactive sputtering) rather than an inert atmosphere or vacuum.

Preferably oxide layer 218 has an average thickness of about 2 monolayers to about 10 monolayers and more preferably 3 to 5 monolayers, although the oxide layer may not be flat especially if the ferromagnetic layer on which the oxide layer is placed is not flat. Excessive oxidation should be avoided so that the free ferromagnetic layer is not completely or mostly oxidized. Oxidation times can be determined empirically for a particular oxygen concentration and a particular oxidation approach.

In other preferred embodiments, electrically insulating layer 218 is formed by the deposition of an oxide such as $NiFeO_x$ that forms a continuous transition between the two substances at the interface with a ferromagnetic material such as NiFe. Other electrically insulating materials can be used such as $Al_2O_3$, $Ta_2O_5$, carbon nitride and diamond-like carbon. Preferred materials for electrically insulating layer 218 may effectively oxidize rough portions of the free ferromagnetic layer to produce specular scattering of electrons. Regardless of the process or materials used to form electrically insulating layer 218, preferably vacuum is not broken between the formation of free ferromagnetic layer 216 and electrically insulating layer 218, although oxygen can be bled selectively into the system at low pressures.

Optional, electrically insulating layer 220 can be produced from any convenient electrically insulating material. For example, layer 220 can be an oxide layer, $Al_2O_3$, $Ta_2O_5$, carbon nitride or diamond-like carbon. Layer 220 preferably has a thickness from about 2 monolayers to about 5 nm.

Figure 6:
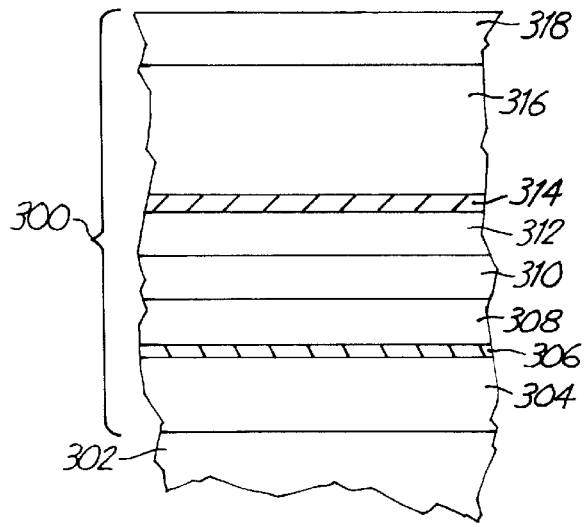
FIG. 6 is a schematic, fragmentary, side view of a top spin valve/GMR sensor on a substrate.

An alternative embodiment of a spin valve is shown in FIG. 6. Spin valve 300 is a top spin valve where the free ferromagnetic layer is oriented toward the substrate relative to the remaining layers of the spin valve. Spin valve 300 is located on an electrically insulating substrate 302.

Top spin valve 300 includes an optional seed layer 304, electrically insulating layer 306, free ferromagnetic layer 308, spacer layer 310, pinned ferromagnetic layer 312, optional electrically insulating layer 314, pinning layer 316 and cap layer 318. Generally, the layers of spin valve 300 can be made from the same materials as the corresponding layers in spin valve 150. Cap layer 318 is generally tantalum. In top spin valve 300, electrically insulating layer 306 may not provide an ideal lattice for the deposition of the remaining layers of the spin valve.

Figure 7:
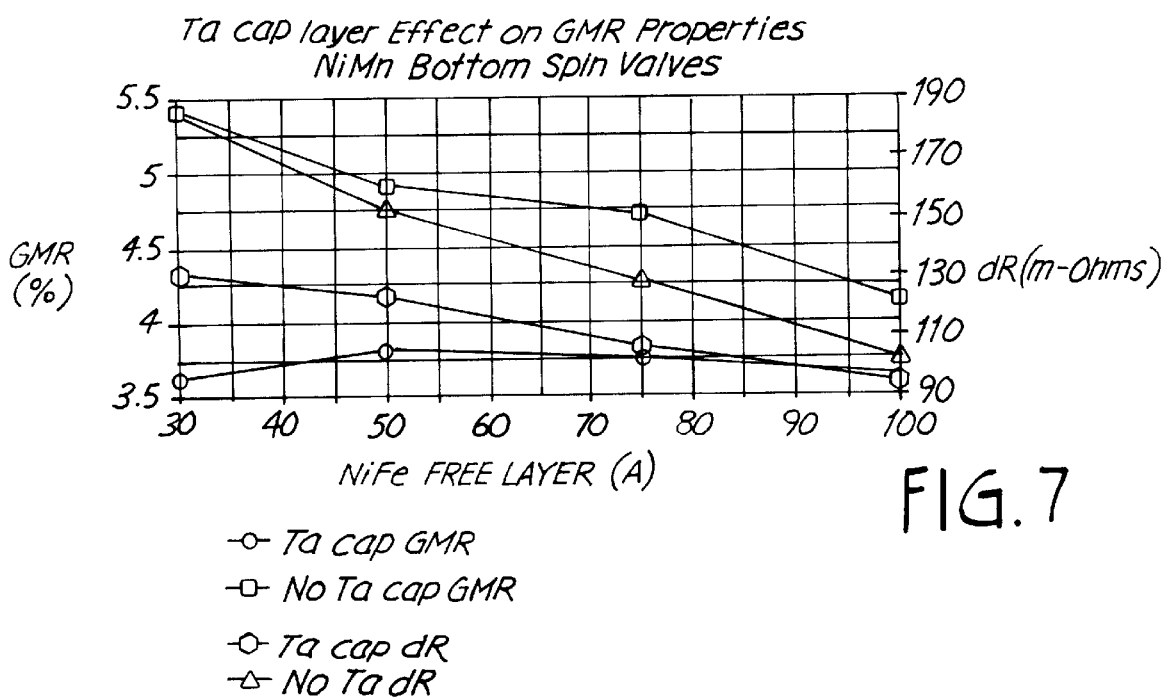
FIG. 7 is a plot of GMR effect in percent and change in resistance (dR in milliohms) from varying the orientation of an external magnetic field both as a function of NiFe free layer thickness for a spin valve/GMR sensor of FIG. 5 and for a corresponding spin valve with a Ta cap.

FIG. 7 displays plots of the GMR effect and of the change in resistance resulting from changing the orientation of the applied magnetic field from parallel to antiparallel. The results marked as not having a Ta cap were measured with a GMR spin valve essentially as shown in FIG. 5. The spin valves used to produce FIG. 7 included a NiMn pinning layer and were annealed as described below. For comparison, results were obtained with a GMR spin valve with comparable pinning layer, ferromagnetic layers and spacer layer as shown in FIG. 5 with the oxide layer replaced with a Ta cap with a thickness of about 50 Å. The spin valves were completed with the addition of a 2nd half gap and a shield.

The results in FIG. 7 are plotted as a function of the thickness of the NiFe alloy in the free ferromagnetic layer. Generally the largest GMR effects and the largest resistance changes (dR) were observed with thinner NiFe ferromagnetic layers. For all NiFe thicknesses, a larger GMR effect and a greater dR was obtained with the spin valve structure of FIG. 5 relative to the comparable spin valve with a Ta cap.

Additional spin valves were tested with two component layer ferromagnetic layers to evaluate the effect of replacing a Ta cap with an oxide layer. These spin valves again had a NiMn pinning layer and were annealed. A first pair of additional spin valves had a 31 nm copper spacing layer and ferromagnetic layers formed from 10 nm of Co and 60 nm of NiFe. The measurements made using these spin valves with an oxide layer or a Ta cap are shown in Table 1.

TABLE 1

| Ta cap | % GMR | R (ohms) | dR (m-ohms) | $H_1$ ($O_e$) | $H_{c1}$ ($O_e$) |
|---|---|---|---|---|---|
| Yes | 3.53 | 3.198 | 113 | 9.5 | 1.5 |
| No | 5.01 | 3.151 | 157 | 19.5 | 1.5 |

$H_1$ is the interlayer coupling field, and $H_{c1}$ is the free layer coercivity.

A second pair of spin valves had a 34 nm copper spacer layer and ferromagnetic layers formed from 10 nm Co and 80 nm NiFe. The measurements made with the second pair are shown in Table 2.

TABLE 2

| Ta cap | % GMR | R (ohms) | dR (m-ohms) | $H_1$ ($O_e$) | $H_{c1}$ ($O_e$) |
|---|---|---|---|---|---|
| Yes | 3.99 | 3.344 | 133 | 9.5 | 1.3 |
| No | 5.82 | 3.06 | 178 | 15.6 | 2 |

These two component ferromagnetic layer spin valves exhibited equivalent or greater enhancement due to the oxide layer as the spin valves used to produce FIG. 7.

The spin valves can be produced using deposition methods that can be controlled to achieve microstructures as described above. A magnetic field on the order of about 50 Oe is applied during the deposition of the layers. Deposition of the layers preferably occurs sequentially, without breaking vacuum between the deposition of sequential layers. Some deposition techniques may not be adversely affected by the breaking of the vacuum between deposition of layers. Suitable deposition techniques include, for example, S-gun deposition, ion beam deposition, and magnetron sputtering.

Generally, the structure is annealed following the deposition of the layers. For example, with NiMn pinning layers, the sensor stacks are annealed at a temperature between about 240–280° C. for at least two hours. In preferred embodiments, the layers are annealed at 270° C. for 10 hours. The initial annealing is performed in a magnetic field of at least 100 gauss. In the initial anneal, the applied magnetic field can be applied in a direction perpendicular to the direction of the magnetic field applied during deposition of the films. Suitable strengths of the magnetic field applied during annealing depend on the shape of the sensor being fabricated. In general, higher magnetic field strengths during annealing are preferred.

The annealing process is necessary to cause the NiMn pinning layers to have desirable, high pinning field strengths. Prior to annealing, the NiMn pinning layers do not produce the necessary magnitudes of the pinning fields. The preferred deposition techniques provide sufficient thermal stability of the layers for the structure to survive the annealing process. If thermal based oxidation is used to form an electrically insulating layer, the oxidation can be performed simultaneously with the annealing.

If desired, a cross-annealing process can be applied after the initial anneal. A cross-anneal involving a magnetic field of at least 100 gauss, with the magnetic field oriented in a direction perpendicular to the magnetic field used in the initial anneal.

The appearance of pinning fields is associated with a phase transformation in the NiMn layer as confirmed by x-ray diffractometry. Specifically, the NiMn material is transformed from a face-centered-cubic (fcc) γ phase to an anti-ferromagnetic face-centered-tetragonal (fct) phase. A pinning field between 400 and 700 Oe is readily obtainable with a NiMn pinning layer appropriately prepared.

Although the present invention has been described with reference to preferred embodiments, workers skilled in the art will recognize that changes may be made in form and detail without departing from the spirit and scope of the invention.

What is claimed is:

1. A spin valve sensor comprising:
   an antiferromagnetic, electrically conductive pinning layer;
   a first layer of ferromagnetic material proximate the pinning layer;
   a second layer of ferromagnetic material;
   a layer of non-ferromagnetic electrically conductive material positioned between the first and second layers of ferromagnetic material;
   a boundary layer of electrically insulating material adjacent to the second layer of ferromagnetic material opposite the layer of non-ferromagnetic, electrically conductive material; and
   an adjacent layer positioned adjacent the boundary layer opposite the second layer of ferromagnetic material, the adjacent layer having no more than moderate electrical conductivity.

2. The spin valve sensor of claim 1 wherein the pinning layer comprises a material selected from the group consisting of NiMn, FeMn, IrMn, PtPdMn, CrMnPt, RuMn and RhMn.

3. The spin valve sensor of claim 1 wherein the pinning layer comprises NiMn.

4. The spin valve sensor of claim 1 wherein the first layer of ferromagnetic material comprises a material selected from the group consisting of Co, NiFe, CoFe, CoZrNb, AlSiFe, NiFeCr and NiFeRe.

5. The spin valve sensor of claim 1 wherein the second layer of ferromagnetic material comprises a material selected from the group consisting of Co, NiFe, CoFe, CoZrNb, NiFeCr and NiFeRe.

6. The spin valve sensor of claim 1 wherein the first layer of ferromagnetic material comprises a layer of Co proximate to the non-ferromagnetic electrically conductive layer, a layer of NiFe proximate the Co layer opposite the non-ferromagnetic electrically conductive layer and a layer of CoFe proximate the NiFe layer opposite the Co layer.

7. The spin valve sensor of claim 1 wherein the second layer of ferromagnetic material comprises a layer of Co proximate the non-ferromagnetic electrically conductive layer, a layer of NiFe proximate the Co layer opposite the non-ferromagnetic electrically conductive layer and a layer of CoFe proximate the NiFe layer opposite the Co layer.

8. The spin valve sensor of claim 1 wherein the non-ferromagnetic, electrically conductive layer comprises copper.

9. The spin valve sensor of claim 1 wherein the boundary layer of electrically insulating material comprises an oxidation layer.

10. The spin valve sensor of claim 9 wherein the oxidation layer has a thickness from about 2 to about 10 monolayers.

11. The spin valve sensor of claim 1 further comprising a second electrically insulating layer between the pinning layer and the first layer of ferromagnetic material.

12. The spin valve sensor of claim 1 further comprising an electrically insulating substrate proximate the pinning layer and opposite the first ferromagnetic layer, the substrate being oriented toward a slider body relative to the pinning layer.

13. The spin valve sensor of claim 1 further comprising an electrically insulating substrate proximate the electrically insulating boundary layer and opposite the second ferromagnetic layer, the substrate being oriented toward a slider body relative to the electrically insulating boundary layer.

14. A slider comprising a spin valve sensor of claim 1.

15. A disc drive system comprising a slider of claim 14.

16. A spin valve sensor of claim 1 wherein the adjacent layer is electrically insulating.

17. A spin valve sensor of claim 1 wherein the adjacent layer forms at least a portion of a half gap.

18. A method of producing a spin valve sensor, the method comprising:
   assembling a multilayer structure on an electrically insulating substrate, the multilayer structure comprising:
      a first layer of ferromagnetic material;
      a second layer of ferromagnetic material;
      a spacer layer of electrically conducting, non-ferromagnetic material positioned between the first and second layers of ferromagnetic material;
      a pinning layer comprising an antiferromagnetic material, proximate the first ferromagnetic layer and opposite the spacer layer;
      an electrically insulating layer proximate the second layer of ferromagnetic material and opposite the layer of electrically conducting non-ferromagnetic material; and
      an adjacent layer positioned adjacent the boundary layer opposite the second layer of ferromagnetic material, the adjacent layer having no more than moderate electrical conductivity.

19. The method of claim 18 wherein the electrically insulating layer comprises an oxide layer.

20. The method of claim 19 further comprising forming the oxide layer with an oxygen-plasma.

21. The method of claim 18 further comprising treating the spin valve sensor at an elevated temperature.

22. The method of claim 18 wherein the substrate is proximate the pinning layer and opposite the first ferromagnetic layer.

23. A spin valve sensor comprising:
   an antiferromagnetic, electrically conductive pinning layer;
   a first layer of ferromagnetic material proximate the pinning layer;
   a boundary layer between the first layer of ferromagnetic material and the pinning layer, the boundary layer being electrically insulating;
   a second layer of ferromagnetic material; and
   a layer of non-ferromagnetic electrically conductive material positioned between the first and second layers of ferromagnetic material.

24. The spin valve sensor of claim 23 wherein the boundary layer comprises an oxide.

25. The spin valve sensor of claim 23 wherein the boundary layer has a thickness from about 2 monolayers to about 5 nm.

* * * * *